United States Patent [19]

Feldstein

[11] 4,265,942

[45] May 5, 1981

[54] NON-NOBLE METAL COLLOIDAL COMPOSITIONS COMPRISING REACTION PRODUCTS FOR ELECTROLESS DEPOSITION

[76] Inventor: Nathan Feldstein, 63 Hemlock Cir., Princeton, N.J. 08540

[21] Appl. No.: 938,890

[22] Filed: Aug. 31, 1978

Related U.S. Application Data

[60] Continuation-in-part of Ser. No. 672,044, Mar. 30, 1976, which is a division of Ser. No. 607,506, Aug. 26, 1975, Pat. No. 3,993,799, which is a continuation-in-part of Ser. No. 512,224, Oct. 4, 1974, abandoned.

[51] Int. Cl.³ .............................................. C23C 3/02
[52] U.S. Cl. .................................. 427/304; 106/1.11; 427/305; 427/306; 427/307
[58] Field of Search ............................... 427/304–306; 106/1.11

[56] References Cited

U.S. PATENT DOCUMENTS

| 3,949,121 | 4/1976 | Kenney | 427/98 |
|---|---|---|---|
| 3,958,048 | 5/1976 | Donovan | 427/304 |
| 3,993,491 | 11/1976 | Feldstein | 427/306 |
| 3,993,848 | 11/1976 | Feldstein | 427/306 |
| 4,082,899 | 4/1978 | Feldstein | 427/306 |

FOREIGN PATENT DOCUMENTS

| 822979 | 1/1975 | Belgium. | |
|---|---|---|---|
| 1590481 | 4/1970 | Fed. Rep. of Germany | 427/98 |
| 49-126999 | 12/1974 | Japan | 427/304 |
| 176037 | 11/1974 | New Zealand. | |
| 1426462 | 2/1976 | United Kingdom. | |

OTHER PUBLICATIONS

Weiser, "Inorganic Colloid Chemistry", vol. 1, pp. 1–5, 137–143, John Wiley & Sons, Inc., ©1933.

Primary Examiner—John D. Smith
Attorney, Agent, or Firm—Thomas J. Macpeak

[57] ABSTRACT

Metallic surfaces are imparted to non-conductors or dielectric substrates by electroless (chemical) plating process comprised of coating the substrates with colloid(s) of non-precious metals and wherein the colloids are prepared in a manner as to impart resistance towards further deterioration.

59 Claims, No Drawings

NON-NOBLE METAL COLLOIDAL COMPOSITIONS COMPRISING REACTION PRODUCTS FOR ELECTROLESS DEPOSITION

REFERENCE TO PRIOR APPLICATIONS

This application is a continuation-in-part of U.S. application Ser. No. 672,044 filed Mar. 30, 1976 which is a division of application 607,506 filed Aug. 26, 1975 now U.S. Pat. No. 3,993,799 which is a continuation-in-part of application Ser. No. 512,224 filed Oct. 4, 1974 now abandoned.

BACKGROUND OF THE INVENTION

In the plating of dielectric substrates by chemical (electroless) plating it is well known that suitable catalytic pretreatment is a prerequisite for effective electroless metal deposition. Such practices are well known and accepted in the art.

In examining the prior art for catalytic pretreatment it appears that while different procedures have been used, the incorporation of precious metals (e.g., palladium containing solutions) was common to all procedures. One catalytic system of particular interest is the two step process as disclosed in U.S. Pat. No. 3,011,920. In the process disclosed, a colloidal solution composed of tin(II) and precious metal salts, generally with hydrochloric acid, is used. The effective catalyst is proposed to be a colloid of an elemental precious metal (e.g., palladium) stabilized by the excess stannous chloride present in the medium. While the system disclosed in U.S. Pat. No. 3,011,920 has been quite popular in commercial practices, rising costs of precious metal, instabilities due to air oxidation, and miscellaneous product reliability problems have led to the quest for new systems in which the use of precious metal as well as hydrochloric acid would be completely eliminated.

In meeting this objective it was found, as described in U.S. Pat. Nos. 3,958,048, 3,993,491, 3,993,799, and 4,087,586 that colloidal systems based upon non-precious metals could constitute the basis for new commercial plating processes. More specifically, it was found and reported that colloidal compositions of non-precious metals (preferably selected from the group of copper, cobalt, iron, nickel and manganese) may be used in the direct replacement of the tin/palladium colloid followed by a treatment (which may be optional) in a suitable reducing medium (activating medium). In the latter treatment a precursor derived from the colloidal dispersion constitutes the catalytic sites useful in the initiation of plating. In the reducing medium, reduction of the ionic portion of the adduct derived from adsorption in the colloidal medium takes place, or surface activation, which results in active nucleating sites capable of initiation of the electroless process. Alternatively, the second step may encompass the selective dissolution of a colloid stabilizer(s) thereby exposing the catalytic nucleus of the colloid, or contacting with a solution comprising soluble compound(s) of catalytic metal. Hence, it should be recognized that the step of activation which is optional generally is intended to reduce the induction time for the actual electroless metal build-up or to remove weakly adsorbed colloids, thereby preventing their contaminating the plating bath(s).

The colloidal nucleus may be in a form of a metallic (elemental) state, or compound bearing the metal, or alloy, and mixtures thereof and the metal(s) must be of a catalytic nature in at least one of its possible oxidation states.

In reviewing the teaching disclosed in the aforementioned issued patents which are included herein by reference, it is recognized that many of the inherent disadvantages associated with the palladium based catalysts are eliminated. It is further recognized that based upon practices in this art it is further essential that any catalytic system should maintain its properties especially with storage (e.g., several months) and shipment under conditions of substantial temperature fluctuation. It is thus highly desirable to have a medium in which good colloidal stability would be maintained, and which at the same time has sufficient catalytic activity to be used in the plating process. I have observed that as one increases stability, activity is decreased thereby making it difficult to meet both requirements in a single preparation step.

For example, I have observed that with successful synthesis of active plating colloids, there is generally a limited stability (for long term purposes) due to coagulation which takes place leading to precipitation, with, of course, change in particle size and distribution during the coagulation process. Also, at times dissolution of the colloidal state may also take place with time. In addition, I have noted that highly stable colloidal dispersions have shown limited catalytic activity when used in accordance with U.S. Pat. No. 3,993,799 with a moderate concentration of reducing medium or activating medium or the omission of any secondary step. Similar trends were also noted in U.S. Pat. No. 3,948,048 on the interrelationship between reactivity and stability. In fact, in U.S. Pat. No. 3,958,048 most of the illustrated examples, when repeated, lost their colloidal character and became true solutions within 24 hours probably due to the interaction of the colloid with air or more particularly with oxygen. Many times the deterioration of the colloid is manifested in visible color change(s). Hence, simple visual observation could determine whether a colloid is deteriorating.

It is thus highly desirable to provide stable colloidal dispersions which would maintain their integrity and resist deterioration by precipitation and/or contact with air. Such colloids may be useful in electroless plating process, catalysis, or any other processes utilizing colloids. It is further desirable to obtain dispersions with very fine particle size distributions. Small size dispersions are particularly useful in adsorption processes and catalysis.

While not wishing to be repetitious, the following are included herein by reference: U.S. Pat. Nos. 3,011,920, 3,993,799, 3,524,754, 3,958,048, 3,993,491, 3,993,801, 4,087,586, 4,048,354, British Pat. No. 1,078,439, and copending applications Ser. Nos. 712,131, now U.S. Pat. No. 4,136,216, 820,904 now U.S. Pat. No. 4,131,699, 833,905 now U.S. Pat. No. 4,151,311 and 854,909 now U.S. Pat. No. 4,132,832.

SUMMARY OF THE INVENTION

Novel colloidal compositions useful in electroless plating processes are disclosed which are particularly stable against further deterioration.

DETAILED DESCRIPTION OF THE INVENTION

The process and composition of the present invention is applicable to the metallic plating of dielectric substrates by autocatalytic or as more commonly known, electroless (chemical) plating. Such processes are well known in the art and they produce a wide variety of products varying from printed circuitry arrays to decorative plated plastics parts.

In some of the above applications the colloids are used after preparation without any further change; however, in others changes may be induced after preparation, e.g., change in the oxidation state of a portion of the colloid.

Although there are many methods for the preparation of colloidal dispersion, the use of the precipitation (chemical) method has been quite popular. In the latter method, the insoluble phase is developed (nucleated) through the interaction of at least two reactants, e.g., a metal compound with a metal reducing agent, or alternately, a soluble metal salt with an alkaline agent. Both reactants should preferably be soluble in a suitable solvent. For general survey of preparatory methods see B. Jirgensons and M. E. Straumanis, "A Short Textbook of Colloid Chemistry," 2nd Edition, The MacMillan Company, New York (1962). The present invention would be illustrated through the preparation of colloidal dispersions by precipitation (chemical) method; however, it is clear that the invention is not limited to the preparation method selected.

The method described in this invention may be applied to any of several colloidal compositions of non-precious metals; the metal may be part of a compound, alloy, or in the metallic state, as well as combinations thereof. Preferred metals are those which are catalytic for electroless metal deposition. Such metals are well known in the art and they are recited in U.S. Pat. Nos. 3,011,920, 3,993,799 and many others.

The term "colloid stabilizer" as used herein is intended to encompass substances which alter the characteristics of the colloid so as to prevent, delay, or minimize their coagulation and precipitation. Stabilizers may be organic or inorganic substances and mixtures thereof. It is believed that these stabilizers are adsorbed onto the surface of the colloid thereby altering the surface charge and hence their stability. Stabilizers contemplated by the present process and composition may include but are not limited to secondary colloids, protein, gelatin, agar agar, gum arabic, surfactants, sugars and polyalcohols (glycerol), and miscellaneous chemicals derived from wood, e.g., lignin, hemicellulose. It is noted that gelatin is a form of protein. In the general sense it is recognized that stabilizers are inherently adsorbed onto the nucleus of the colloid or participate within the double-layer structure of the colloid. Moreover, it is recognized that in the colloidal dispersion preferably at least one colloid stabilizer must be present.

The term "surfactant" (or surface active agent) as used herein generally refers to substances which are capable of lowering the surface tension of a liquid or the interfacial tension between two liquids. All useful surfactants possess the common feature of a water-soluble (hydrophilic) group attached to an organic (hydrophobic) chain. Surfactants as used herein are also intended to encompass detergents, dispersants, and emulsifying agents regardless of whether or not they lower the surface tension of a liquid (e.g., water).

The term "primary metal" as used herein generally refers to metal selected from the group consisting of copper, nickel, cobalt and iron and mixtures thereof. These metals exist in the colloidal catalytic composition as a reaction product which may be in the elemental state, compound, or alloy, and mixtures thereof. For a source of the primary metals soluble or insoluble compounds bearing such metals may be used.

The term "secondary metal" as used herein generally refers to metals selected from the group of metals selected from Groups IIIA, IVA, and VA of the Periodic Table of the Elements and preferably selected from the group consisting of antimony, lead, thallium, tin and chromium, and mixtures thereof. These metals may exist in the colloidal catalytic composition as a reaction product along with any of the primary metals and further they may be in the elemental state, compound, or alloy, and mixtures thereof. For a source of the secondary metals soluble or insoluble compounds bearing said metals may be used. It is also recognized that other metals such as zinc, cadmium, indium, and bismuth are similar in their chemical properties to the above secondary metals. Hence, the substitution of these metals falls within the spirit of the present invention. In preparing the colloidal composition and the utilization of the secondary metal(s), it is preferable to use these metals in compounds in which they are in the lowest oxidation state, e.g., Cr in $+3$ oxidation state rather than in $+6$ oxidation state. While generally these secondary metal(s) are not as active as the primary metal(s), their incorporation generally results in maintaining the integrity of the colloids and in particular averting the deterioration of the colloids. While I do not wish to be bound by theory, it is believed that the secondary metal(s) react chemically with the primary metal(s) leading to a reaction product(s) which provides with the improved results against deterioration. The reaction product(s) may be an alloy(s) or compound(s) of these metals. It is also noted that many of the secondary metals, when used without reacting with the primary metal(s), or added post colloid nucleation, act as inhibitors as demonstrated in Ser. No. 833,905. These metal(s) may exist in a wide concentration range relative to the primary metal(s).

The term "precipitating agent" as used herein refers to chemical substances which upon their interaction with compounds bearing the catalytic metal(s) (primary and/or secondary metals) lead to the formation of an insoluble (colloidal) phase in the solvent (e.g., water). Any of several chemical substances may be used ranging from reducing agents (e.g., hydrides and its derivatives, hypophosphorus acid and its derivatives, hydrazine, formaldehyde, tannic acid, dithionate, sulfites, etc.) to hydroxides, sulfides, chromates, phosphate and others. Also, active metals may be used as possible reducing agent, e.g., zinc with copper ions. Depending upon the nature of the precipitating agent any of several types of insoluble phases may be formed. The use of precipitating agents is well documented and is further demonstrated in the references included by reference in the present application. In the formation of the colloidal state, many times thermal energy must be supplied as to overcome the activation energy required for nucleation of the insoluble.

Generally speaking it is noted that non-conductor substrates may be classified as vitreous type and organic type, depending upon the residual charge on the surface. The former generally constitute materials which are ceramic, glass, and the like, which generally are negative surfaces due to oxygen exposed at the interface. By contrast, the second group generally constitute organic materials which in general, and especially upon etching of such substrates, are positively charged.

Hence, for effective adsorption it should be recognized that it is generally preferable to use colloids which are charged in the opposite charge of the substrate surface which is to be metallized, through intermediate "layers" may be used onto the substrate which alter its effective charge.

The following examples are provided to illustrate the findings of the present invention. These examples are not to be taken as in limitation of the invention, but it should be recognized that the invention encompasses various combinations thereof and the concentrations may be varied.

EXAMPLE 1

An alumina ceramic substrate was immersed into a colloidal composition comprising the reaction product of the following components. The reaction was carried forth at about 50° C.

$CuCl_2$: 0.04 M
$Sn(BF_4)_2$: 0.032 M
Gelatin: 5.0 g/l
$NaBH_4$: 0.05 M
NaOH: 0.5 M The substrate was immersed for several minutes and thereafter water rinsed, and directly immersed into a commercial electroless copper (Enplate 404) operating at room temperature. Spontaneous plating of copper was noted.

In the course of evaluating compositions of tin/copper it was surprisingly and unexpectedly found that:
1. The product exhibits a greater stability when exposed to air in comparison to copper alone.
2. Similar improvement of the copper colloid was achieved by the combination of two distinct colloidal compositions: the first was copper alone and the second was of tin alone. Hence, both modes of preparation fall into the spirit of the present invention.
3. Examination of tin/copper colloidal product by electron microscopy diffraction and transmission modes appears to yield new interaction product(s), probably an alloy of these metals. Specifically, it was noted that the diffraction patterns showed the disappearance of certain d-spacings as well as the formation of new lines. Also noted were particles of about 50 A in size whereas the particles of the tin colloid alone were much greater in size.
4. The concentration for tin relative to copper can be used over a wide range.

Substitution of nickel or iron or cobalt for copper or in addition to copper is self evident.

EXAMPLE 2

A colloidal composition was prepared comprising the reaction product of the admixture comprising
$CuCl_2$: 0.04 M
$TlNO_3$: 0.002 M
Arabic Gum: 11.8 g/l
$NaBH_4$: 0.04 M
NaOH: 0.5 M The resulting pH was 12 and the nucleation reaction was carried out above room temperature. Comparison of this resulting colloidal product to copper alone showed a greater stability towards exposure to air.

EXAMPLE 3

A colloidal composition comprising of copper and tin was prepared by the admixing of:

$CuCl_2.2H_2O$: 10.6 g/l
Sodium citrate: 25 g/l
$SnCl_2.2H_2O$: 19.2 g/l

Prior to the addition of the tin, the solution (at pH 14) was heated to about 100° C. and final pH adjustment of the product was made to about 12.5. The formation of a brown-gray colloid was noted.

Immersion of an etched ABS susbtrate followed by electroless copper showed that plating has taken place. The preparation of the above colloid was made based upon Weiser, Vol. I, "Inorganic Colloid Chemistry", p. 137, John Wiley & Sons (1933).

EXAMPLE 4

A colloidal composition comprising the admixture of the following chemicals was nucleated above room temperature. The nickel was added post copper colloid nucleation and the final pH was adjusted to 8.0.

$CuCl_2$: 0.04 M
$NiCl_2$: 0.01 M
$NaBH_4$: 0.039 M
NaOH: 0.196 M
$(NH_2)_2CS$: 0.0067 M
Orzan-S: 12.0 g/l This product showed a superior stability to deterioration in comparison to the same product in the absence of added $(NH_2)_2CS$. While I do not wish to be bound by theory, it is believed that the addition of thiourea results in adsorption onto the colloid and provides protection against further deterioration. Homologs of thiourea were also used, e.g., $(NH_2)_2CO$ and $(NH_2)_2CSe$. However, their effectiveness was not as good as the thiourea. It is further realized that it is the thio group

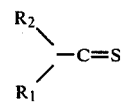

that provides the present effect and thus substituting other thio containing compounds falls within the spirit of this invention. $R_1$ and $R_2$ may be various groups from alkyl, amines, aromatics, hydrogen, halogen, and mixtures thereof.

EXAMPLE 5

A colloidal composition comprising the reaction product resulting from the admixture of the following reactants was prepared. Nucleation took place above room temperature. Final pH was about 12. The resulting colloidal composition showed a greater visual stability in comparison to the same without the added antimony. Hence, antimony in combination with the copper primary metal is a useful combination.

$CuCl_2$: 0.04 M
$SbCl_3$: 26.8 g/l
Arabic Gum: 8.8 g/l
$NaBH_4$: 0.049 M
NaOH: 0.49 M

EXAMPLE 6

A colloidal composition similar to above was prepared, except that lead was used instead of the antimony trichloride. Specifically, the lead was Pb (from fluoroborate solution) at 0.04 M. Final pH about 12 and greater stability were noted. Substitution of equimolar $Cr^{+3}$ for the lead also showed a tendency for the formation of a more stable product(s) relative to copper alone.

While the above examples are provided to illustrate the novel aspects of the present invention one skilled in the art should recognize that many other chemicals and means may be used to achieve the useful results of this invention. Such adaptations and modifications fall within the spirit of the present invention. Furthermore, it is possible that the colloidal composition may be prepared by the suspension of an available dry powder or semi-dried powder in a suitable solvent; such approach in combination with the composition disclosed falls within the spirit of this invention. In using the present invention both soluble and insoluble compounds may be used as starting chemicals for the colloid preparation though soluble compounds are preferred. Moreover, any of several oxidation states may be applied (e.g., Cu(I) and Cu(II)).

It is further noted as recognized in U.S. Pat. Nos. 3,993,491 and 3,993,799 that compatible electroless plating compositions should be used for achieving best results.

It is further recognized that in the event that the insoluble phase (colloid) is formed with the assistance of a precipitating agent, the solvent to carry forth the reaction may be of aqueous or non-aqueous type. Moreover, contemplating the present invention the colloidal composition may be dispersed in aqueous or non-aqueous solvents.

What I claim is:

1. A process for the preparation of a non-conductor substrate for electroless (chemical) deposition onto a substrate comprising the steps of:
   (1) contacting said substrate with a colloidal composition said colloidal composition being the reaction product resulting from the admixture comprising at least one primary metal and at least one secondary metal, said primary metal being selected from the group consisting of copper, nickel, iron and cobalt and mixtures therof, said secondary metal being selected from the group consisting of tin, aluminum, gallium, chromium, indium, germanium, lead, antimony, bismuth zinc and thallium and mixtures thereof, said primary and said secondary metals being in less than the maximum available oxidation state in said colloidal composition which is retained on the surface of said substrate either directly forms or serves as a precursor to the catalytic sites capable of electroless plating initiation, and
   (2) contacting said treated substrate with an electroless (chemical) plating bath.

2. The process according to claim 1 wherein said primary metal is copper.

3. The process according to claim 2 wherein said secondary metal is preferably selected from the group consisting of indium, thallium, antimony and tin.

4. The process according to claim 2 wherein said secondary metal is thallium.

5. The process according to claim 1 wherein said primary metal is copper and further contains nickel and wherein said nickel is added post colloid nucleation.

6. The process according to claim 1 wherein said colloidal composition is prepared by the suspension of a dry or semi-dried powder in a suitable solvent.

7. The process according to claim 1 wherein said colloidal composition further contains at least one colloid stabilizer.

8. The process according to claim 1 wherein said colloidal composition is of negative colloids.

9. The process according to claim 1 wherein said colloidal composition is of positive colloids.

10. The process according to claim 1 wherein said non-conductor is a vitreous substrate.

11. The process according to claim 1 wherein said non-conductor substrate is organic.

12. The process according to claim 1 wherein said colloidal catalytic composition was prepared by a precipitation method using a precipitating agent.

13. The process according to claim 12 wherein said precipitating agent is an hydride.

14. The process according to claim 1 wherein said electroless deposition is of copper.

15. The process according to claim 1 wherein said substrate is part of a printed circuitry.

16. The process according to claim 1 further containing the step of activation whereby the induction time for electroless metal deposition is reduced.

17. The process according to claim 1 wherein said colloidal composition is derived from starting chemical(s) which are soluble and/or insoluble compound(s).

18. The process according to claim 1 wherein said primary metal is copper and further wherein said copper is derived from a Cu(I) compound.

19. The process according to claim 1 further containing the step of activation and wherein said activation encompasses the selective dissolution of a colloid stabilizer thereby exposing the catalytic nucleus of the colloid.

20. The process according to claim 1 further containing a treatment step which alters the effective charge on the non-conductor substrate and wherein said treatment step is prior to the step of contacting said substrate with the colloidal composition.

21. The process according to claim 1 wherein said colloidal composition results from the reduction of copper with tin(II) and further wherein said reduction takes place in an alkaline pH medium.

22. The process according to claim 1 wherein said colloidal composition results from the simultaneous precipitation of the primary and secondary metals.

23. The process according to claim 1 wherein said colloidal composition results from the admixing of the primary and secondary metals, each however having been precipitated before said admixing.

24. The process according to claim 1 wherein said colloidal composition is prepared by the interaction of compounds bearing the catalytic metal(s) with a precipitating agent.

25. The process according to claim 1 wherein said precipitating agent is selected from the group consisting of hydride and its derivatives, hypophosphorus acid and its derivatives, hydrazine, formaldehyde, tannic acid, dithionate, sulfites, hydroxides, sulfides, phosphates and active metals and mixtures thereof.

26. A process for the metallization of a non-conductor substrate by electroless (chemical) plating deposition comprising the steps of:
   (1) contacting said substrate with a colloidal composition being the reaction product resulting from the admixture comprising of at least one primary metal, and at least one secondary metal, said primary metal being selected from the group consisting of copper, nickel, iron, and cobalt, and mixtures thereof, said secondary metal being selected from the group consisting of tin, aluminum, gallium, chromium, indium, germanium, lead, antimony, bismuth and thallium and mixtures thereof, said primary and secondary metals being reduced in said colloidal composition through the interaction with a chemical reducing agent(s) and wherein said colloid in said colloidal composition which is retained on the surface of said substrate either directly forms or serves as a precursor to the catalytic sites capable of electroless plating initiation, and (2) contacting said treated substrate with an electroless (chemical) plating bath.

27. The process according to claim 26 wherein said colloidal composition further contains at least one colloid stabilizer.

28. The process according to claim 26 wherein said primary metal is copper.

29. The process according to claim 26 wherein said secondary metal is selected from the group consisting of indium, thallium, antimony, and tin.

30. The process according to claim 26 wherein said secondary metal is thallium.

31. The process according to claim 26 wherein said primary metal is copper and further contains nickel and wherein said nickel is added post colloid nucleation.

32. The process according to claim 26 wherein said colloidal composition is prepared by the suspension of a dry or semi-dry powder in a suitable solvent.

33. The process according to claim 26 wherein said colloidal composition is of negative colloids.

34. The process according to claim 26 wherein said colloidal composition is of positive colloids.

35. The process according to claim 26 wherein said substrate is a vitreous substrate.

36. The process according to claim 26 wherein said substrate is organic.

37. The process according to claim 26 wherein said chemical reducing agent is an hydride.

38. The process according to claim 26 wherein said colloidal composition was prepared by the precipitation method using a precipitating agent.

39. The process according to claim 26 wherein said electroless deposition is of copper.

40. The process according to claim 26 further containing the step of activation whereby the induction time for electroless plating deposition is reduced.

41. The process according to claim 26 wherein said substrate is etched prior to the contacting of said substrate with the colloidal catalytic composition.

42. The process according to claim 26 wherein said colloidal composition is derived from starting chemicals which are soluble and/or insoluble compounds.

43. The process according to claim 26 wherein said primary metal is copper and further wherein said copper is derived from a copper (I) compound.

44. The process according to claim 26 further containing the step of rinsing said substrate after the contacting of said substrate with said colloidal composition.

45. The process according to claim 26 further containing the step of activation and wherein said activation encompasses the selective dissolution of a colloid stabilizer thereby exposing the catalytic nucleus of the colloid.

46. The process according to claim 26 further containing a treatment step which alters the effective charge on said substrate and wherein said treatment step is prior to the step of contacting said substrate with the colloidal composition.

47. The process according to claim 26 wherein said colloidal composition results from the reduction of copper along with tin (II) and further wherein said reduction takes place in an alkaline pH medium.

48. The process according to claim 26 wherein said colloidal composition results from a simultaneous precipitation of the primary and secondary metals.

49. The process according to claim 26 wherein said colloidal composition results from the admixing of the primary and secondary metals, each, however having been precipitated before said admixing.

50. The process according to claim 26 wherein said colloidal composition is prepared by the interaction of compounds bearing the catalytic metal(s) with a precipitating agent.

51. The process according to claim 26 wherein the precipitating agent is selected from the group consisting of hydride and its derivatives, hypophosphorous acid and its derivatives, hydrazine, formaldehyde, tannic acid, dithionate, sulfites, hydroxide, sulfide, phosphate and active metals and mixtures thereof.

52. The process according to claim 26 wherein said secondary metal is zinc.

53. The process according to claim 26 wherein said secondary metal is chromium in the $+3$ oxidation state.

54. The process according to claim 26 wherein said secondary metal is lead.

55. The process according to claim 26 wherein said colloidal composition is derived through the nucleation of starting chemicals which are in an insoluble phase.

56. The process according to claim 26 wherein said primary metal is copper and wherein said secondary metal is tin and said reducing agent is a soluble borohydride.

57. The process according to claim 26 wherein said electroless plating bath is a compatible bath with said colloid in said colloidal composition.

58. The process according to claim 26 wherein said colloidal composition is dispersed in an aqueous medium.

59. The process according to claim 26 wherein said colloidal composition is dispersed in a non-aqueous solvent.

* * * * *